(12) United States Patent
Fredeman et al.

(10) Patent No.: US 10,930,339 B1
(45) Date of Patent: Feb. 23, 2021

(54) VOLTAGE BITLINE HIGH (VBLH) REGULATION FOR COMPUTER MEMORY

(71) Applicant: International Business Machines Corporation, Armonk, NY (US)

(72) Inventors: Gregory J. Fredeman, Wappingers Falls, NY (US); Bishan He, Poughkeepsie, NY (US); Dinesh Kannambadi, Wappingers Falls, NY (US); Kenneth J. Reyer, Stormville, NY (US); Donald W. Plass, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/587,496

(22) Filed: Sep. 30, 2019

(51) Int. Cl.
*G11C 11/408* (2006.01)
*G11C 11/4094* (2006.01)
*G11C 11/4091* (2006.01)
*G11C 5/14* (2006.01)

(52) U.S. Cl.
CPC .......... *G11C 11/4094* (2013.01); *G11C 5/147* (2013.01); *G11C 11/4085* (2013.01); *G11C 11/4091* (2013.01)

(58) Field of Classification Search
CPC ....... G11C 8/08; G11C 5/147; G11C 11/4094; G11C 11/4085; G11C 11/4091
See application file for complete search history.

(56) References Cited

U.S. PATENT DOCUMENTS

| | | | |
|---|---|---|---|
| 5,103,425 A * | 4/1992 | Kuo | G11C 16/08 257/316 |
| 5,365,200 A | 11/1994 | Honnigford et al. | |
| 5,760,620 A | 6/1998 | Doluca | |
| 6,535,025 B2 | 3/2003 | Terzioglu et al. | |
| 7,982,500 B2 | 7/2011 | Luich | |
| 8,599,639 B2 | 12/2013 | Akiyama et al. | |
| 10,546,641 B1 * | 1/2020 | Vahidimowlavi | G11C 8/08 |
| 2001/0012219 A1 * | 8/2001 | Lee | G11C 16/30 365/189.09 |
| 2003/0151072 A1 | 8/2003 | Leung et al. | |
| 2006/0202741 A1 | 9/2006 | Tran et al. | |

(Continued)

FOREIGN PATENT DOCUMENTS

| | | |
|---|---|---|
| CN | 1691204 A | 11/2005 |
| EP | 1815303 B1 | 1/2009 |
| EP | 3273320 A1 | 1/2018 |

OTHER PUBLICATIONS

Transmittal Form PTO/SB/21 signed Mar. 16, 2020.

(Continued)

*Primary Examiner* — Jay W. Radke
(74) *Attorney, Agent, or Firm* — Cantor Colburn LLP; William Kinnaman

(57) ABSTRACT

Techniques for voltage bitline high (VBLH) regulation for a computer memory are described herein. An aspect includes generating, by a resistor ladder and a diode compensation footer, a VBLH reference signal based on a high voltage (VPP) in a computer memory module. Another aspect includes regulating a VBLH signal based on the VBLH reference signal. Another aspect includes regulating a word-line driver voltage of the computer memory module based on the VBLH signal.

20 Claims, 5 Drawing Sheets

(56) References Cited

U.S. PATENT DOCUMENTS

| | | |
|---|---|---|
| 2012/0206988 A1 | 8/2012 | Song et al. |
| 2013/0163357 A1* | 6/2013 | Buer .................... G11C 11/417 365/201 |
| 2013/0249624 A1 | 9/2013 | Akiyama et al. |

OTHER PUBLICATIONS

Fredeman et al., "Negative Voltage Generation for Computer Memory," U.S. Appl. No. 16/587,501, filed Sep. 30, 2019.
IBM "List of IBM Patents or Patent Applications Treated as Related; (Appendix P)", Filed Sep. 30, 2019, 2 pages.
Fredeman et al., "Bit-Line Mux Driver With Diode Header for Computer Memory," U.S. Appl. No. 16/587,560, filed Sep. 30, 2019.

\* cited by examiner

VOLTAGE BITLINE HIGH (VBLH) REGULATION FOR COMPUTER MEMORY

BACKGROUND

The present invention generally relates to computer memory, and more specifically, to voltage bitline high (VBLH) regulation for a computer memory.

Computer memory modules including embedded dynamic random access memory (eDRAM) are widely used for their improved performances in high-speed computing applications. An eDRAM module may include a plurality of cells arranged in an array, each cell being addressed by a word line (WL) and a bit line (BL). Each cell may contain a transistor that may include a high threshold voltage (e.g., thick oxide) n-type metal oxide semiconductor (NMOS) device and a deep trench capacitor. The NMOS gate may be connected to the signal WL which is driven to high voltage (VPP), which may be approximately 1.55 volts (V), when writing to or reading from the cell, and a negative voltage (VWL), which may be approximately −0.4V, when a cell is in standby.

SUMMARY

Embodiments of the present invention are directed to voltage bitline high (VBLH) regulation for a computer memory. A non-limiting example computer-implemented method includes generating, by a resistor ladder and a diode compensation footer, a VBLH reference signal based on a high voltage (VPP) in a computer memory module. The method also includes regulating a VBLH signal based on the VBLH reference signal. The method also includes regulating a wordline driver voltage of the computer memory module based on the VBLH signal.

Other embodiments of the present invention implement features of the above-described method in systems and devices.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
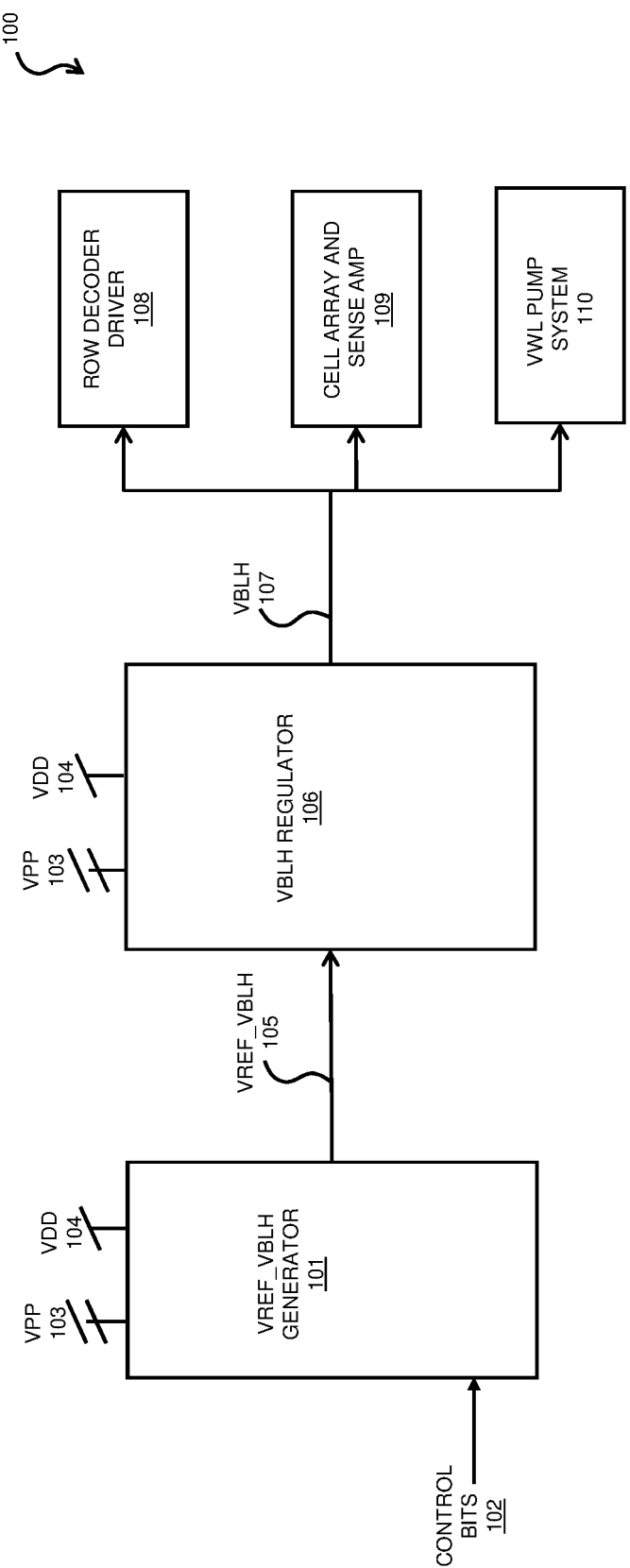
FIG. 1 is a block diagram of components of a voltage bitline high (VBLH) regulation system for a computer memory in accordance with one or more embodiments of the present invention.

One or more embodiments of the present invention provide voltage bitline high (VBLH) regulation for a computer memory. A computer memory that is used in conjunction with embodiments of VBLH regulation may be embedded in an integrated circuit, such as a processor chip including embedded memory such as eDRAM. The high voltage (VPP) and negative voltage (VWL) supplies in an embedded dynamic random access memory (eDRAM) module may violate a maximum allowed voltage (VMAX) of logic devices that are used in the row decoders and drivers of the word line (WL) signal, which may be approximately 1.15 volts (V). An eDRAM module may generate a relatively low internal voltage VBLH to avoid VMAX conditions in the eDRAM module. VBLH may be used to run local bitline and sense amp structures in the eDRAM module. The relatively low voltage level of VBLH may avoid cell disturb fails in the computer memory module. VBLH may be regulated to be lower than the standard supply voltage (VDD), and may vary over a defined range to track process, voltage, temperature (PVT) variables of the memory module. VBLH may track the PVT variables in a relatively limited way to stay in a desired range (e.g., from about 0.7V to about 0.9V) across the PVT range of the operation of the memory module. The VBLH voltage may be programmable in order to compensate for extreme PVT conditions in the computer memory, as well as to compensate for adjustments made to the VPP and VWL voltages.

Embodiments of a VBLH regulation system may include a VBLH reference voltage (VREF_VBLH) generator and a VBLH regulator. VREF_VBLH may be generated using an adjustable resistor ladder. The adjustable resistor ladder may create an adjustable voltage reference. To generate a relatively stable current over a range of PVT variables and operating voltages in the memory module, VPP may be used by the adjustable resistor ladder to generate VREF_VBLH because VPP may be a relatively stable voltage on the memory chip. The resistor ladder drops the relatively high VPP voltage enough to not violate the VMAX of the memory module at the first field effect transistor (FET) of the VBLH regulator. An adjustable diode compensation footer may be included in the VREF_VBLH generator to raise or lower the VREF_VBLH that is generated by the adjustable resistor ladder based on PVT conditions in the memory module. The resistor ladder and diode compensation footer may be configured based on the projected PVT conditions of the memory module by a plurality of control bits in some embodiments.

VREF_VBLH is provided to a VBLH regulator circuit including a current mirror and comparator that includes a differential amplifier. The differential amplifier compares VREF_VBLH to VBLH. The current mirror may scale the current in the VBLH regulator circuit by a factor (e.g., 2.5), and, if VBLH is determined by the comparator to drop below VREF_VBLH, the current mirror may dump current into VBLH to bring the VBLH back up above VREF_VBLH. In some embodiments, the VBLH regulator circuit may include a diode stack at an output of the VBLH regulator circuit that creates a current that trickles off of the VBLH output to keep VBLH in a desired range (e.g., from 0.7V to 0.9V). The diode stack may include n-type metal oxide semiconductor (NMOS) and p-type metal oxide semiconductor (PMOS) devices. The threshold voltage (VT) type of the diode stack may mirror the VT type of devices used in the sense amplifiers of the memory module to keep VBLH stable in skewed PVT conditions. The VBLH regulator may also provide VBLH to the WL driver and the VWL system to prevent the internal voltages in the WL driver and the VWL system from violating VMAX. For example, to alleviate a VMAX condition in the computer memory, VBLH may be provided into the WL driver and row decode system in a cascoded structure to limit any internal signals to be less than VMAX. The regulator may have a gain of 1, such that VBLH goes to the input voltage. The VBLH regulator may control the voltage going to the sense amplifier to balance signal margins for 0's vs 1's across the PVT range.

Turning now to FIG. 1, a VBLH regulation system 100 for a computer memory is generally shown in accordance with one or more embodiments of the present invention. Embodiments of VBLH regulation system 100 may be embedded in a processor chip that includes eDRAM computer memory. System 100 receives a plurality of control bits 102 that may configure the operation of the system 100. The control bits 102 may be direct current (DC) signals that are provided to the system 100. In some embodiments, the control bits 102 may be configured during initial set up of the VBLH regulation system 100 based on the projected operating conditions (e.g., PVT conditions) of the memory module that contains the VBLH regulation system 100, and may not be changed during operation of the memory module including the VBLH regulation system 100. System 100 is connected to VPP 103, which may be about 1.55V in some embodiments, and to supply voltage VDD 104. System 100 includes VREF_VBLH generator 101, which generates and outputs VREF_VBLH 105 to a VBLH regulator 106. VBLH regulator 106 may regulate VBLH 107 to be a relatively low, stable voltage (e.g., 0.7V to 0.9V) based on VREF_VBLH 105. The VBLH regulator 106 outputs VBLH 107 to a row decoder driver 108, a cell array and sense amplifier 109, and a VWL pump system 110 of the computer memory module. Row decoder driver 108, cell array and sense amplifier 109, and VWL pump system 110 may be used to perform operations regarding a cell array (e.g., cell reads and writes) of an eDRAM memory module. VREF_VBLH generator 101 is discussed in further detail below with respect to FIG. 2. VBLH regulator 106 is discussed below in further detail below with respect to FIG. 3. Cell array and sense amplifier 109 is discussed in further detail below with respect to FIG. 4.

It is to be understood that the block diagram of FIG. 1 is not intended to indicate that the system 100 is to include all of the components shown in FIG. 1. Rather, the system 100 can include any appropriate fewer or additional components not illustrated in FIG. 1 (e.g., additional memory components, embedded controllers, functional blocks, connections between functional blocks, modules, inputs, outputs, etc.). Further, the embodiments described herein with respect to system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
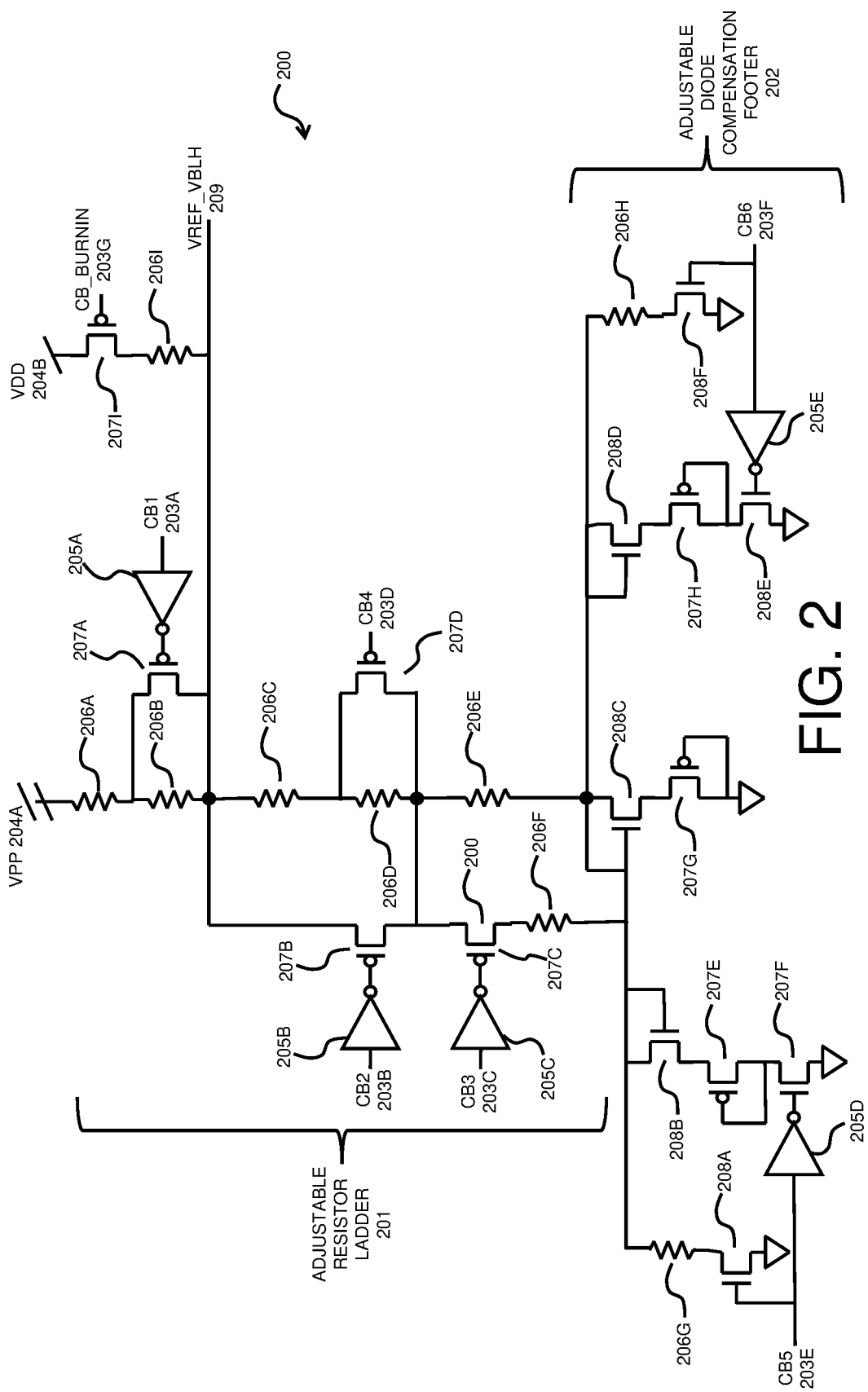
FIG. 2 is a block diagram of components of a VBLH reference voltage (VREF_VBLH) generator circuit for a VBLH regulation system in accordance with one or more embodiments of the present invention.

FIG. 2 is a block diagram of components of a VREF_VBLH generator circuit 200 for a VBLH regulation system in accordance with one or more embodiments of the present invention. VREF_VBLH generator circuit 200 may correspond to embodiments of VREF_VBLH generator 101 of FIG. 1. The VREF_VBLH generator circuit 200 includes an adjustable resistor ladder 201 and adjustable diode compensation footer 202, which are configured based on a plurality of control bits 203A-G, which may be DC signals that are included in control bits 102 of FIG. 1. In some embodiments, the control bits 203A-G may be configured during initial set up of the VREF_VBLH generator circuit 200 based on the projected operating conditions (e.g., PVT conditions) of the memory module that contains the VREF_VBLH generator circuit 200, and may not be changed during operation of the memory module including the VREF_VBLH generator circuit 200.

Adjustable resistor ladder 201 includes a plurality of resistors 206A-F connected between VPP 204A and adjustable diode compensation footer 202. Because VPP 204A may be a relatively high voltage (e.g., 1.55V), the adjustable resistor ladder 201 is configured to drop VPP 204A in order to generate VREF_VBLH 209 at an appropriate level. Various resistors 206A-F of the adjustable resistor ladder 201 may be bypassed based on control bits 203A-D, which are provided to the gates of respective p-type field effect transistors (PFETs) 207A-D. Control bits 203A-C are provided to PFETs 207A-C via inverters 205A-C. Turning the PFETs 207A-D of the tunable resistor ladder on or off based on control bits 203A-D may configure the level of VREF_VBLH 209 that is output by the VREF_VBLH generator circuit 200. In some embodiments, resistor 206A may be a 16 kilo (K) ohm resistor; resistor 206B may be a 4K ohm resistor; resistor 206C may be a 0.5K ohm resistor; resistor 206D may be a 15 Kohm resistor; resistor 206E may be a 5K ohm resistor, and resistor 206F may be a 7.5K ohm resistor.

Adjustable diode compensation footer 202 includes inverters 205D-E, resistors 206G-H, PFETs 207 E, G, and H, and n-type field effect transistors (NFETs) 208A-F and 207F. The PFETs 207 E, G, and H and NFETs 208A-F and 207F of adjustable diode compensation footer 202 may be turned off and on based on control bits 203E-F to raise or lower VREF_VBLH 209 based on PVT conditions in the computer memory device that includes VREF_VBLH generator circuit 200. The adjustable diode compensation footer 202 connects the adjustable resistor ladder 201 to ground. Control bit 203E provides a gate voltage to NFET 208A, and control bit 203F provides a gate voltage to NFET 208F. Adjustable diode compensation footer 202 includes a plurality of N-P diodes (e.g., NFET 208B and PFET 207E; NFET 208C and PFET 207G; NFET 208D and PFET 207H) that are controlled based on control bits 203E-F via resistors 206G-H and inverters 205D-E. In some embodiments, resistor 206G may be a 22K ohm resistor, and resistor 206H may be a 16K ohm resistor. In some embodiments, PFET 207E may be a 24 fin FET, PFET 207G may be a 12 fin FET, and PFET 207H may be a 12 fin FET. In some embodiments, NFET 208B may be a 24 fin FET, NFET 208C may be a 12 fin FET, and NFET 208D may be a 12 fin FET.

An output of the VREF_VBLH generator circuit 200 is connected to VDD 204B via resistor 206I and PFET 207I, which is turned off or on by control bit 203G. Control bit 203G may be enabled to turn on PFET 207I during burn-in of the memory module that includes the VREF_VBLH generator circuit 200 in some embodiments, in order to limit VERF_VBLH 209, and may be disabled during operation of the memory module. In some embodiments, resistor 206I may be a 10K ohm resistor. The output of VREF_VBLH generator circuit 200 provides VREF_VBLH 105/209 to VBLH regulator 106 of FIG. 1.

It is to be understood that the block diagram of FIG. 2 is not intended to indicate that the circuit 200 is to include all of the components shown in FIG. 2. Rather, the circuit 200 can include any appropriate fewer or additional components not illustrated in FIG. 2 (e.g., NFETs, PFETs, diodes, voltages, resistors, capacitors, connections between circuit elements, ground connections, control bits, etc.). Further, the embodiments described herein with respect to circuit 200 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 3:
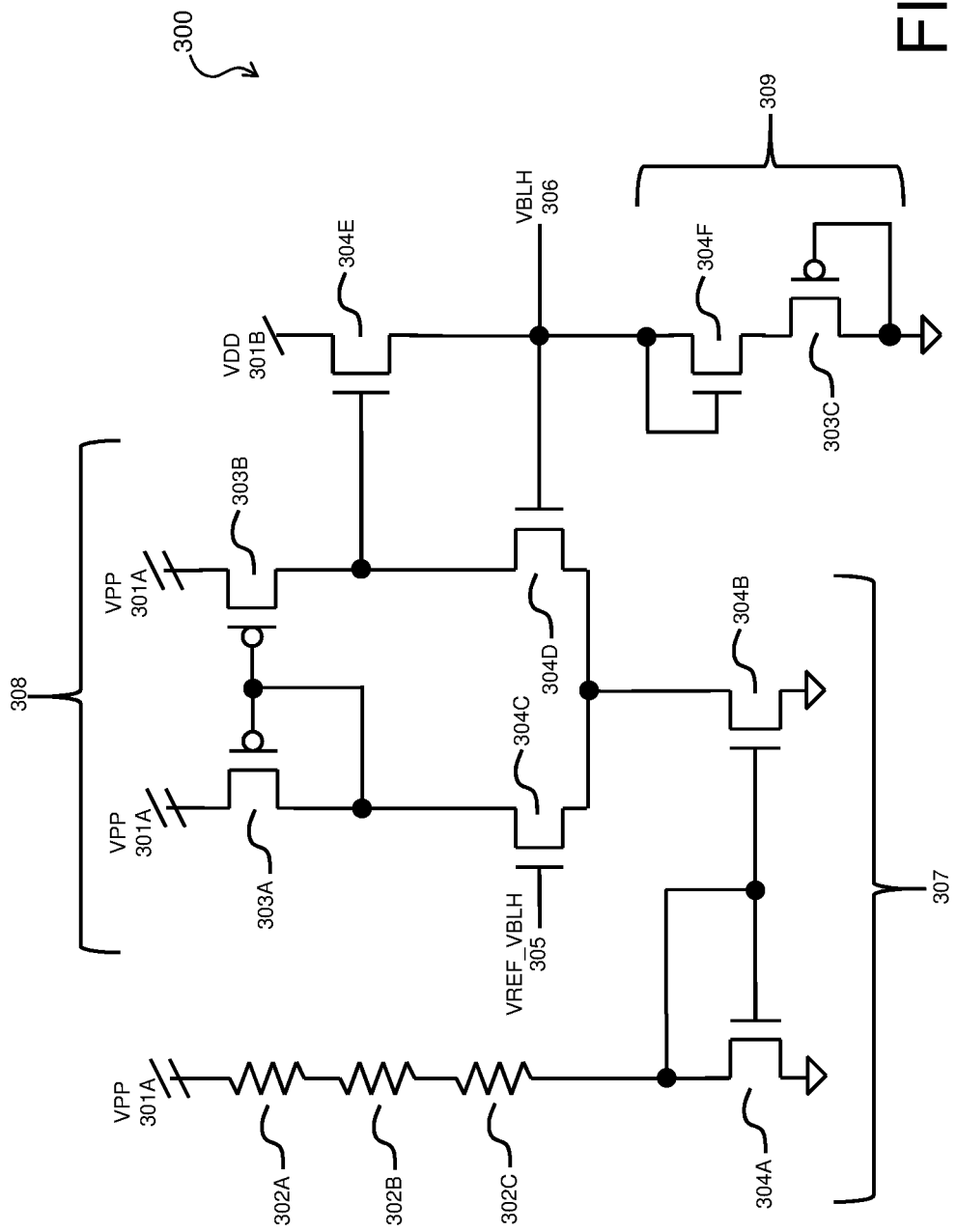
FIG. 3 is a block diagram of components of a VBLH regulator circuit in accordance with one or more embodiments of the present invention.

FIG. 3 is a block diagram of components of VBLH regulator circuit 300 for a VBLH regulation system in accordance with one or more embodiments of the present invention. VBLH regulator circuit 300 may correspond to embodiments of VBLH regulator 106 of FIG. 1. VBLH 306 is regulated to stay above VREF_VBLH 305 by the VBLH regulator circuit 300. VBLH regulator circuit 300 includes a current mirror 307 comprising resistors 302A-C and NFETs 304A-B. The current mirror 307 connects VPP 301A to ground via resistors 302A-C and NFETs 304A-B. Resistors 302A-C determine a gate voltage that is provided to NFETs 304A-B of the current mirror 307. The current mirror 307 may scale the current in the VBLH regulator circuit 300 by a factor (e.g., 2.5). The VBLH regulator circuit 300 also includes a comparator 308 comprising a differential amplifier comprising PFETs 303A-B and NFETs 304C-D that are connected between VPP 301A and the current mirror 307. VREF_VBLH 305 is received from the VREF_VBLH generator 101 of FIG. 1 at the gate of NFET 304C in the comparator 308. The comparator 308 compares VREF_VBLH 305 to VBLH 306. If VBLH 306 is determined by comparator 308 to drop below VREF_VBLH 305, the gate of NFET 304E may be driven high, turning on NFET 304E and dumping additional current into VBLH 306. When VBLH 306 reaches VREF_VBLH 305, the comparator may turn off NFET 304E.

In some embodiments, the VBLH regulator circuit 300 may include a diode stack 309 at an output of the VBLH regulator circuit 300 that creates a current that trickles off of VBLH 306 to keep VBLH 306 within the desired range (e.g., 0.7V to 0.9V). The diode stack 309 includes NFET 304F and PFET 303C. The threshold voltage (VT) type of the diode stack 309 may mirror the VT type used in the sense amplifiers of the memory module that contains the VBLH regulator circuit 300 to keep VBLH 306 stable skewed PVT conditions. VBLH 306 is also connected to VDD 301B via NFET 304E. NFET 304E may be a relatively strong NFET that may turn on to connect VDD 301B to VBLH 306 based on a detected voltage droop in VBLH 306.

In some embodiments, resistor 302A may be an 11K ohm resistor, resistor 302B may be an 11K ohm resistor, and resistor 302C may be an 11K ohm resistor. In some embodiments, PFET 303A may be a 24 fin FET, PFET 303B may be a 24 fin FET, and PFET 303C may be a 12 fin FET. In some embodiments, NFET 304A may be an 8 fin FET, NFET 304 B may be a 20 fin FET, NFET 304C may be a 60 fin FET, NFET 304D may be a 60 fin FET, NFET 304E may be a 600 fin FET, and NFET 304F may be an 18 fin FET.

It is to be understood that the block diagram of FIG. 3 is not intended to indicate that the circuit 300 is to include all of the components shown in FIG. 3. Rather, the circuit 300 can include any appropriate fewer or additional components not illustrated in FIG. 3 (e.g., NFETs, PFETs, diodes, voltages, resistors, capacitors, connections between circuit elements, ground connections, control bits, etc.). Further, the embodiments described herein with respect to circuit 300 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 4:
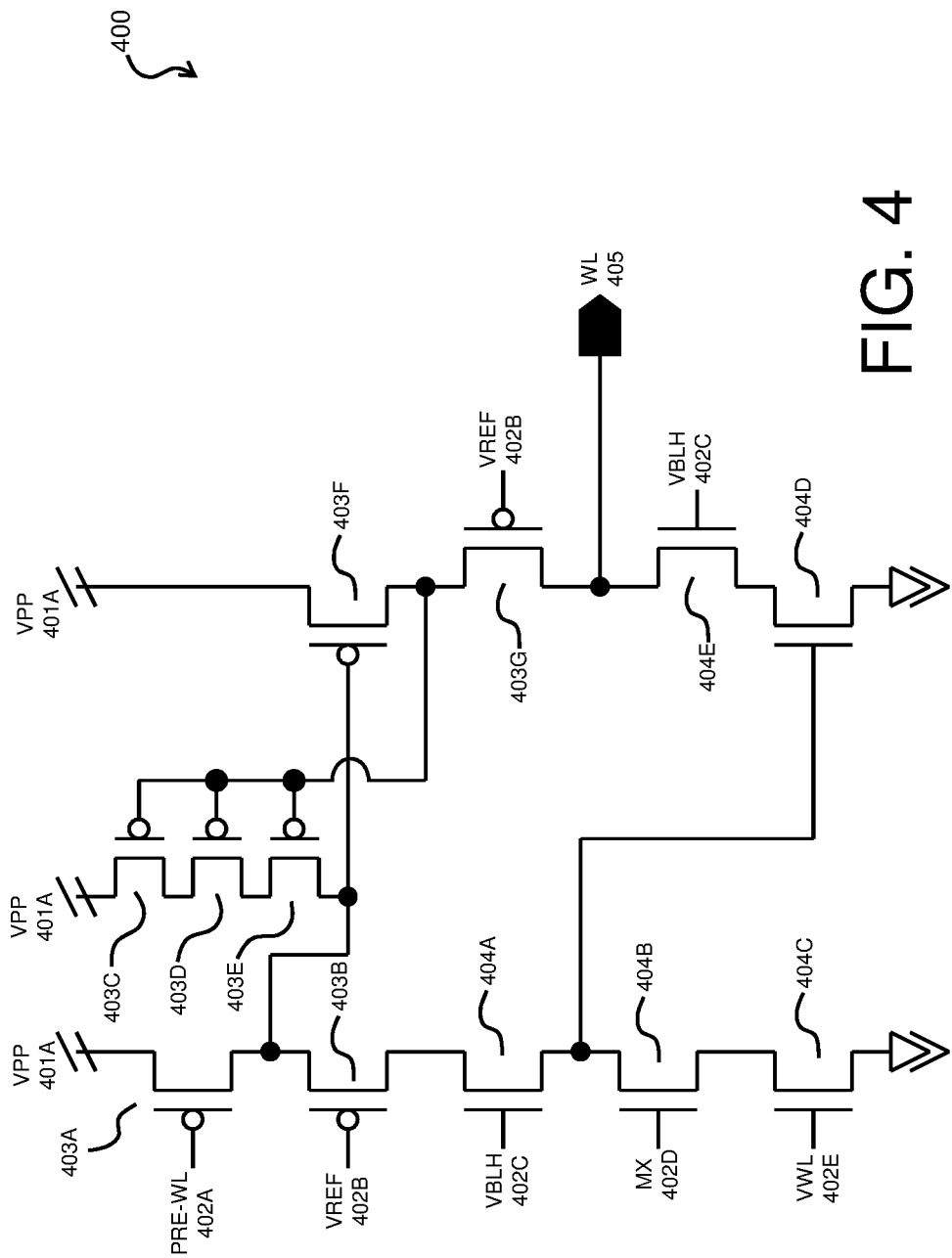
FIG. 4 is a block diagram of components of wordline (WL) driver circuit for a VBLH regulation system in accordance with one or more embodiments of the present invention.

FIG. 4 is a block diagram of components of wordline driver circuit 400 for a VBLH regulation system in accordance with one or more embodiments of the present invention. Wordline driver circuit 400 may be included in embodiments of a cell array and sense amplifier 109 of FIG. 1, and may drive a wordline of an eDRAM array. The wordline driver circuit 400 receives a pre-wordline voltage (PRE-WL) 402A at the gate of PFET 403A, VREF 402B at the gate of PFET 403B, VBLH 402C at the gate of NFET 404A, MX 402D at the gate of NFET 404B, and VWL 402E at the gate of NFET 404C. The PFETs 403A-E and NFETs 404A-C are turned off and on based on their respective gate voltages to provide a gate voltage to each of PFET 403F and NFET 404D. PFET 403F and NFET 404D are connected between ground and VPP 401A to generate a wordline (WL) voltage 405 that is output by wordline driver circuit 400. WL voltage 405 swings between VWL (e.g., approximately −0.4V) and VPP 401A (e.g., approximately 1.55V). During a cell read or write, the WL voltage 405 may be VPP 401A; during cell standby, the WL voltage 405 may be VWL. PFET 403G is controlled by VREF 402B to connect the WL voltage 405 to VPP 401A. VBLH 402C, which is received from the VBLH regulator 106 of FIG. 1 and controls NFET 404A and NFET 404E, acts to regulate internal WL driver voltages to stay below VMAX.

In some embodiments, PFET 403A may be a 5 fin FET, PFET 403B may be a 10 fin FET, PFET 403C may be a 2 fin FET, PFET 403D may be a 2 fin FET, PFET 403E may be a 2 fin FET, PFET 403G may be a 50 fin FET. In some embodiments, NFET 404A may be a 10 fin FET, NFET 404B may be a 10 fin FET, NFET 404C may be a 10 fin FET, NFET 404D may be a 30 fin FET, and NFET 404E may be a 30 fin FET.

It is to be understood that the block diagram of FIG. 4 is not intended to indicate that the circuit 400 is to include all of the components shown in FIG. 4. Rather, the circuit 400 can include any appropriate fewer or additional components not illustrated in FIG. 4 (e.g., NFETs, PFETs, diodes, voltages, resistors, capacitors, connections between circuit elements, ground connections, control bits, etc.). Further, the embodiments described herein with respect to circuit 400 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 5:
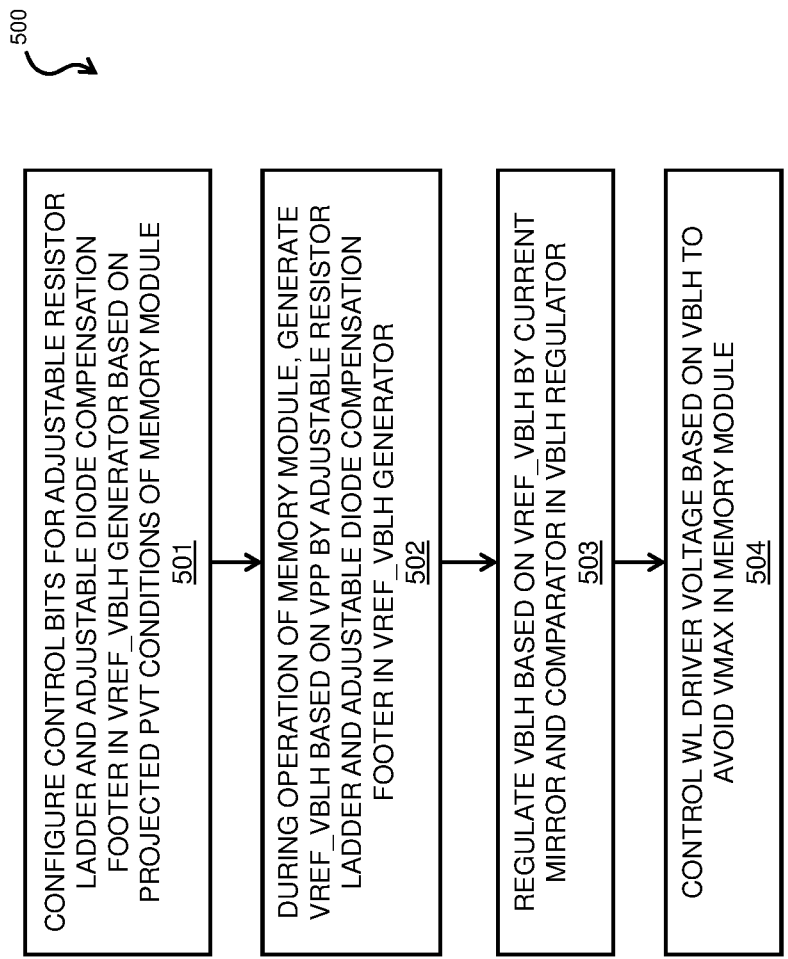
FIG. 5 is a flow diagram of a process for VBLH regulation in accordance with one or more embodiments of the present invention.

FIG. 5 shows a process flow diagram of a method 500 for VBLH generation and regulation in accordance with one or more embodiments of the present invention. Method 500 may be implemented in VBLH regulation system 100 of FIG. 1. In block 501, a plurality of control bits 102 comprising DC signals may be configured to generate VBLH 107 within a desired range (e.g., 0.7V to 0.9V) based on projected PVT conditions of the memory module that includes the VBLH regulation system 100. The control bits that are configured in block 501 may correspond to control bits 203A-D corresponding to adjustable resistor ladder 201, and control bits 203E-F, corresponding to adjustable diode compensation footer 202, of VREF_VBLH generator circuit 200 of FIG. 2.

In block 502, during operation of the memory module that includes the VBLH regulation system 100, VREF_VBLH 105 is generated by VREF_VBLH generator 101. VREF_VBLH may be generated based on VPP 103/204A by adjustable resistor ladder 201 and adjustable diode compensation footer 202 of VREF_VBLH generator circuit 200 of FIG. 2 based on the control bits that were set in block 501 of FIG. 1. In block 503 of method 500, VBLH regulator 106 outputs VBLH 107 based on VREF_VBLH 105 that is received from VREF_VBLH generator 101. VBLH 107 may be regulated to be within the desired range (e.g., 0.7V to 0.9V) by a current mirror 307, a comparator 308, and a diode stack 309, as discussed above with respect to VBLH regulator circuit 300 of FIG. 3. VBLH may further be regulated by a relatively strong NFET such as NFET 304A of FIG. 3 that connects VBLH to supply voltage VDD. In block 504 of method 500, VBLH 107 is used to regulate internal WL driver voltages of a wordline driver (e.g., wordline driver circuit 400 as shown in FIG. 4) of the memory module to avoid VMAX conditions in the memory module. Blocks 502-504 of method 500 may be performed continuously throughout the operation of the memory module.

The process flow diagram of FIG. 5 is not intended to indicate that the operations of the method 500 are to be executed in any particular order, or that all of the operations of the method 500 are to be included in every case. Additionally, the method 500 can include any suitable number of additional operations.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
    generating, by a resistor ladder and a diode compensation footer, a voltage bitline high (VBLH) reference signal based on a high voltage (VPP) in a computer memory module;
    regulating a VBLH signal based on the VBLH reference signal; and
    regulating a wordline driver voltage of the computer memory module based on the VBLH signal.

2. The method of claim 1, wherein the VBLH signal is regulated based on the VBLH reference signal by a current mirror and a comparator.

3. The method of claim 2, wherein the VBLH signal is further regulated by a diode stack connected at an output of the comparator, wherein the diode stack creates a current that trickles off of the VBLH signal to maintain the VBLH signal within a desired range during operation of the computer memory module.

4. The method of claim 3, wherein the diode stack comprises at least one field effect transistor (FET) having a threshold voltage corresponding to a threshold voltage of a FET located in a sense amplifier of the computer memory module.

5. The method of claim 1, wherein the resistor ladder comprises an adjustable resistor ladder, the diode compensation footer comprises an adjustable diode compensation footer, and the method comprising:
    receiving a plurality of control bits, each of the plurality of control bits comprising a direct current (DC) signal, corresponding to the adjustable resistor ladder and the adjustable diode compensation footer, such that the plurality of control bits determine the VBLH reference signal based on projected process, voltage, and temperature (PVT) conditions in the computer memory module during operation of the computer memory module.

6. The method of claim 5, wherein a control bit of the plurality of control bits is configured to bypass a resistor of the adjustable resistor ladder.

7. The method of claim 1, wherein the computer memory module comprises an embedded dynamic access memory (eDRAM) memory module that is embedded in a processor chip.

8. A system comprising a circuit configured to:
    generate, by a resistor ladder and a diode compensation footer, a voltage bitline high (VBLH) reference signal based on a high voltage (VPP) in a computer memory module;
    regulate a VBLH signal based on the VBLH reference signal; and
    regulate a wordline driver voltage of the computer memory module based on the VBLH signal.

9. The system of claim 8, wherein the VBLH signal is regulated based on the VBLH reference signal by a current mirror and a comparator.

10. The system of claim 9, wherein the VBLH signal is further regulated by a diode stack connected at an output of the comparator, wherein the diode stack creates a current that trickles off of the VBLH signal to maintain the VBLH signal within a desired range during operation of the computer memory module.

11. The system of claim 10, wherein the diode stack comprises at least one field effect transistor (FET) having a threshold voltage corresponding to a threshold voltage of a FET located in a sense amplifier of the computer memory module.

12. The system of claim 8, wherein the resistor ladder comprises an adjustable resistor ladder, the diode compensation footer comprises an adjustable diode compensation footer, and the circuit configured to:
    receive a plurality of control bits, each of the plurality of control bits comprising a direct current (DC) signal, corresponding to the adjustable resistor ladder and the adjustable diode compensation footer, such that the plurality of control bits determine the VBLH reference signal based on projected process, voltage, and temperature (PVT) conditions in the computer memory module during operation of the computer memory module.

13. The system of claim 12, wherein a control bit of the plurality of control bits is configured to bypass a resistor of the adjustable resistor ladder.

14. The system of claim 8, wherein the computer memory module comprises an embedded dynamic access memory (eDRAM) memory module that is embedded in a processor chip.

15. A device, comprising logic configured to:
    generate, by a resistor ladder and a diode compensation footer, a voltage bitline high (VBLH) reference signal based on a high voltage (VPP) in a computer memory module;
    regulate a VBLH signal based on the VBLH reference signal; and
    regulate a wordline driver voltage of the computer memory module based on the VBLH signal.

16. The device of claim 15, wherein the VBLH signal is regulated based on the VBLH reference signal by a current mirror and a comparator.

17. The device of claim 16, wherein the VBLH signal is further regulated by a diode stack connected at an output of the comparator, wherein the diode stack creates a current that trickles off of the VBLH signal to maintain the VBLH signal within a desired range during operation of the computer memory module.

18. The device of claim 17, wherein the diode stack comprises at least one field effect transistor (FET) having a threshold voltage corresponding to a threshold voltage of a FET located in a sense amplifier of the computer memory module.

19. The device of claim 15, wherein the resistor ladder comprises an adjustable resistor ladder, the diode compensation footer comprises an adjustable diode compensation footer, and the logic configured to:
    receive a plurality of control bits, each of the plurality of control bits comprising a direct current (DC) signal, corresponding to the adjustable resistor ladder and the adjustable diode compensation footer, such that the plurality of control bits determine the VBLH reference signal based on projected process, voltage, and temperature (PVT) conditions in the computer memory module during operation of the computer memory module.

20. The device of claim 19, wherein a control bit of the plurality of control bits is configured to bypass a resistor of the adjustable resistor ladder.

* * * * *